United States Patent [19]

Chen et al.

[11] Patent Number: 5,145,836
[45] Date of Patent: Sep. 8, 1992

[54] METHOD FOR PRODUCING SHAPED PARTS FROM HIGH TEMPERATURE OXIDE METAL SUPERCONDUCTIVE COMPOSITES

[75] Inventors: In-Gann Chen, Northport; Doru M. Stefanescu, Tuscaloosa; Subhayu Sen, Tuscaloosa; Joel Betts, Tuscaloosa, all of Ala.

[73] Assignee: The University of Alabama, Tuscaloosa, Ala.

[21] Appl. No.: 115,410

[22] Filed: Nov. 2, 1987

[51] Int. Cl.$^5$ .............................. H01B 12/00
[52] U.S. Cl. ............................ 505/1; 264/61; 505/739; 505/775; 505/780; 505/781; 505/785
[58] Field of Search ........... 264/56, 60, 61, 125, 264/127; 164/97; 505/1, 807, 822, 823, 809, 810, 739, 775, 780, 781, 785

[56] References Cited

U.S. PATENT DOCUMENTS

| | | | |
|---|---|---|---|
| 3,828,839 | 8/1974 | Dhingra | 164/97 |
| 4,146,080 | 3/1979 | Baum | 164/97 |
| 4,762,754 | 8/1988 | Nellis et al. | 428/552 |
| 4,892,861 | 1/1990 | Ray | 505/1 |

FOREIGN PATENT DOCUMENTS

61-189864  8/1986  Japan .......................... 164/97

OTHER PUBLICATIONS

Komeda et al., "Fluorine Incorporation Scheme in Ba-Y-Cu-O-F High Temperature Superconductors", High Temperature Superconductors II, Ed Capone et al., 1988, pp. 305–308.
Ovshunsky et al., "Superconductivity in the Fluorinated YBaCuO", Mat. Res. Soc. Symp. Proc., vol. 99, pp. 549–552, 1988.
Robinson et al., "Sinter Forged YBa$_2$Cu$_3$O$_{7-\delta}$", Adv. Cer. Mat., vol. 2, No. 3B, 1987, pp. 380–387.
Murr et al., "Introducing the Metal Matrix High Temperature Superconductor", Adv. Mat. Proc., vol. 132, Issue 4, Oct. 1987, pp. 36–39.

*Primary Examiner*—Mary Lynn Theisen
*Attorney, Agent, or Firm*—Oblon, Spivak, McClelland, Maier & Neustadt

[57] ABSTRACT

A technique which produces macroscopically homogeneous-shaped parts utilizes oxide-metal superconductor composites by providing a mixture of a superconductor oxide, a metal and either a oxygen or a fluorine donor.

5 Claims, 1 Drawing Sheet

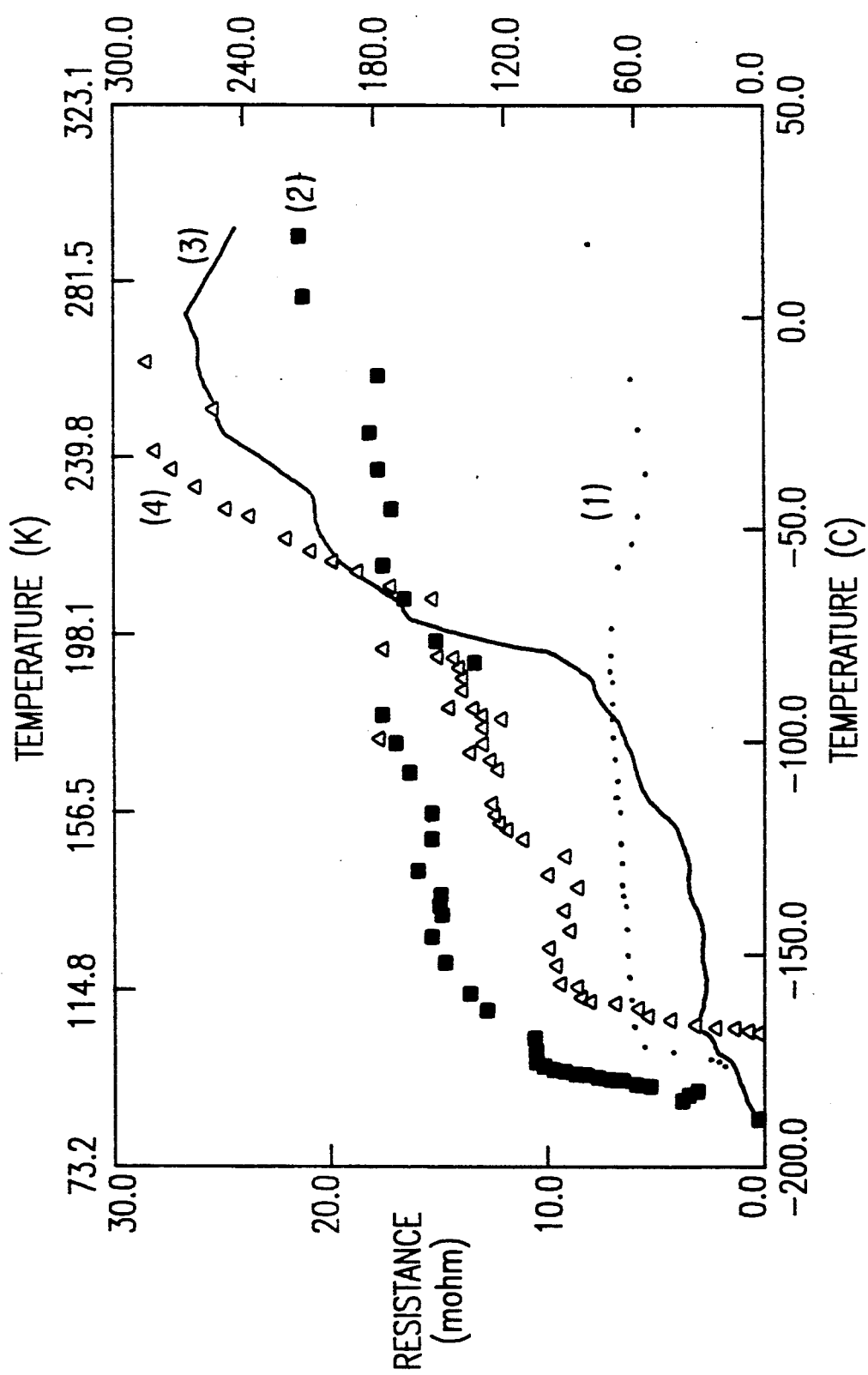

METHOD FOR PRODUCING SHAPED PARTS FROM HIGH TEMPERATURE OXIDE METAL SUPERCONDUCTIVE COMPOSITES

BACKGROUND OF THE INVENTION

1. Field of the Invention

This invention relates to a technique for fabrication of shaped parts from composite materials containing a superconductive oxide with the shaped parts having a superconducting-normal transition temperature above the liquid nitrogen boiling temperature.

2. Discussion of Background

Several compositions of superconductive powders exist in the prior art having transition temperatures above the boiling point of nitrogen.

Examples of such recent prior art are disclosed in "Superconductivity at 93K in a New Mixed-Phase Y—BA—Cu—O Compound System at Ambient Pressure", by M. K. Wu, et al, Physical Review Letters, (58) 9, Mar. 2, 1987, pp. 908. This system utilizes $YBa_2Cu_3O_{(7-x)}$. Other examples include R. J. Cava. et al, "Bulk Superconductivity at 91K in Single-Phase Oxygen-Deficient Perovskite $Ba_2YCu_3O_{9-x}$", Physical Review Letters, (58) 16, Apr. 20, 1987, pp. 1676, and $YBa_2Cu_3F_xO_y$, see S. R. Ovshinsky, et al, "Superconductivity at 155K", Physical Review Letters (58) 24, Jun. 15, 1987, pp. 2579.

Other similar compositions have been recently disclosed wherein Y is replaced by other Rare Earth metals as for example, P. H. Hor, et al, "Superconductivity Above 90K in the Square-Planar Compound System $ABa_2Cu_3O_{6+x}$ with A=Y, La, Nd, 5m, Fu, Gd, Ho, Er, and Lu", Physical Review Letters, (58) 18, May 4, 1987, pp. 1891.

The primary goal with each of these constructions is to produce shaped parts from these powders which presents tremendous difficulties pertaining to both the method of processing and the resulting properties. Typical among these problems are brittleness and low formability subsequent to sintering.

The prior art processing methods for parts which are made of 1-2-3 oxides involve traditional ceramic processing (e.g. mixing-pressing-sintering, mixing-casting-sintering), and forming superconductor wire by molten oxide processing as indicated by S. Jin et al, "Fabrication of Dense $Ba_2YCu_3O_{7-x}$ Superconductor Wire by Molten Oxide Processing", Applied Physics Letters 51(12), Sep. 21, 1987. Other methods involve, for example, "superconductors-composite wire fabrication, S. Jin et al, "High Tc Superconductors-Composite Wire Fabrication", Applied Physics Letters 51(3), Jul. 20, 1987, and the explosive cladding technique, Lawrence E. Murr, Alan W. Hare, Nicholas G. Eror, "Introducing: The Metal-Matrix High Temperature Superconductor", Advanced Materials & Processes', Inc., Metal Progress, October, 1987.

The numerous disadvantages of each of the above processes result from the fact that they each involve the 1-2-3 powder, which will produce a part which is both mechanically hard and very brittle. Although the superconductors-composite wire fabrication process results in better mechanical properties, it can only be utilized for the production of specialized shaped parts such as wires. On the other hand, the explosive cladding technique is a very complicated process which only allows for the production of simple shaped parts, which also have the disadvantage of non-uniform macro-structure, composed of two different materials.

Therefore, it is quite obvious that a need exists, and, in fact, an urgency exists, to produce shaped parts from higher temperature superconductive materials which overcome the disadvantages of the prior art methods of producing shaped parts.

SUMMARY OF THE INVENTION

Accordingly, one object of the present invention is to provide a novel process for the production of shaped parts which provide resultant parts which exhibit superior mechanical properties as well as superconductive properties above the boiling point of nitrogen.

It is also an object of the present invention to provide a process for the production of complicated shaped parts from oxide-metal composites which exhibit a uniform macro structure having the desired superconductive and mechanical properties.

It is also an object of the present invention to provide a process for the production of superconductive shaped parts whereby the mechanical, electrical and magnetic properties are controlled over a wide range based upon the ratio between the superconductive oxide and the metal of the composite material.

The foregoing and other objects are attained by the present invention through the utilization of a process for the production of shaped parts from high temperature oxide/metal superconductor composites which entail mixing 20 to 90% by volume of a metal with 80 to 10% of superconductive oxide powder or fibers and 1 to 20% of an oxygen donor and/or 1 to 10% of a fluorine donor.

BRIEF DESCRIPTION OF THE DRAWINGS

A more complete appreciation of the invention and many of the attended advantages thereof will be readily obtained as the same becomes better understood by reference to the following detailed description when considered in conjunction with the accompanying drawing, wherein:

the FIGURE illustrates the variation of electrical resistances with temperature for four different samples.

DETAILED DESCRIPTION OF THE PREFERRED EMBODIMENTS

With reference being made to the accompanying drawing, the present invention is addressed to the production of shaped parts which are homogeneous on a macroscopic scale and which are produced from oxide-metal superconductor composites by using a mixture of a superconductor oxide, a metal and an oxygen and/or fluorine donor.

The method of the present invention has been based upon the relationship between conductive materials and superconductive materials based on the percolation theory. This theory states that a mixture of a conductive material with a non-conductive material will conserve its electrical conductivity up to a critical volume fraction of non-conductive material. The present invention seeks to extend this principle to superconductive materials.

Observation based upon the mixture of superconductive oxides with non-superconductive metals provides an indication that superconductive properties are conserved up to a certain critical volume of metal when a noble metal is used. When non-noble metal such as Al, Pb, Cu were utilized, the superconductive properties were only observed in certain of the samples based upon what is understood as the depletion of oxygen at the grain boundaries of the superconductive powder.

In an attempt to overcome this problem, it was necessary to add into the composite certain amounts of either an oxygen donor and/or a fluorine donor. This makes up for the depletion of oxygen at the grain boundaries.

According to the present invention, a superconductive composite material contains 20 to 90% by volume metal, 80 to 10% by volume superconductive oxide and 1 to 20% by volume of an oxygen donor and/or a fluorine donor. In a preferable embodiment the range of the volume of the oxygen and/or the fluorine donor is in the 5 to 10% by volume range. This process, according to the present invention, is attainable thus far only by using powders of the above materials or using a combination of powders and molten metals.

The process of the present invention has the significant advantage that the produced composite superconductive materials have uniform macro-structure when using non-noble metals such as Aluminum or Copper. This is possible because the oxygen level at the surface of the grains is controlled by the oxygen and/or fluorine donors. The composite produced by the present invention is such that it can be produced by a variety of methods including a mixing of solid powders followed by pressing and sintering or by squeeze casting, when a liquid metal is infiltrated between the grains of the superconductive powder.

The procedure for production of the oxide-metal superconductor composite materials involves mixing a superconductive oxide powder with a metal powder and a powder consisting of the oxygen or fluorine donor. This mixture is then compacted in a metallic die in order to achieve a part of the ultimate desired shape. Then the shaped portion is sintered in flowing oxygen. During this process the oxygen which is removed from the superconductor oxide by the metal is replaced by the oxygen donor. When a fluorine donor is used, on the other hand, the oxygen removed by the metal is replaced by fluorine and thus the transition temperature is raised as is shown in the FIGURE. In order to decrease the volume fraction of superconductive powder but still maintain comparable superconductive properties and at the same time improve the mechanical properties, superconductive fibers may be utilized.

As an alternative process for producing the oxide-metal superconductive composite materials in particular shaped parts, the process may consist of mixing a superconductive oxide powder with an oxygen and/or fluorine donor and subsequently infiltrating the powder preform with liquid metal.

The FIGURE details a graph of temperature versus resistance measurement for 4 different compounds beginning with what is labeled as plot 1 (1-2-3) which refers to a superconductor powder and, more particularly, what is known as the $Y_1Ba_2Cu_3O_{7-x}$ which exhibits a transition onset at approximately $-191°$ C. (82 K$^\phi$). Plot 2 refers to the mixture of the superconductive powder with 40% by volume aluminum and 5% by volume of $Ag_2O$. Plot 3 which has a resistance scale shown on the right side of the FIGURE refers to a combination of superconductor powder of 55% with 40% aluminum and 5% CdO which serves as an oxygen donor. Plot 4 refers to a fluorine donor and involves a combination of the superconductor powder with 40% aluminum and 5% polytetrafluoroethylene which acts as a fluorine donor.

The resulting transitions temperatures are evident from the graphs and the following discussion illustrates the development from the superconductor powder to the shaped part of a particular example.

EXAMPLE 1

A particular detailed example will now be given which provides the above mentioned composite exhibiting the onset of superconductivity above the boiling point of nitrogen as indicated in the Figure.

The metal powder utilized in the example was Aluminum and $Ag_2O$ served as the oxygen donor. The correct proportions (by atomic ratio) of $Y_2O_3$, $BaCO_3$ and $CuO$ were mixed and ground using a mortar and pestle. The grinding operation was carried out until the entire mass exhibited a uniform dark grey color. In the subsequent step, this particular uniform color powder was placed in a ceramic crucible and put in a tube furnace at 950° C. for 16 hours under flowing $O_2$.

After the furnace was shut off, the powder was allowed to cool to room temperature inside the furnace under the flowing oxygen. The resulting porous mass of $YBa_2Cu_3O_{7-x}$ was ground once again and compacted to ½ inch diameter pellets and sintered at 900 degrees C for 5 and ½ hours under flowing oxygen. Once again the resultant was cooled to room temperature inside the furnace under flowing oxygen. These sintered pellets of $Y_1Ba_2Cu_3O_{7-x}$ exhibited a transition onset at $-191°$ C. (82K).

In the next step the superconducting pellets were again ground and mixed with the required weights of Al and $Ag_2O$ to provide a mixture containing 55% of $YBa_2Cu_3O_{7-x}$ by volume, 40% of aluminum by volume and 5% $Ag_2O$ by volume.

This mixture was again ground until it produced a uniform color. Then it was once again pressed into ½ inch diameter pellets having two millimeter thicknesses under a ram pressure of 8 tons. These pellets were then sintered at 600° C. for 5 hours flowing $O_2$. After allowing them to cool to room temperature under $O_2$, a measurement of resistance as a function of temperature was made and is shown in the Figure.

Obviously, numerous and additional modifications and variations of the present invention are possible in light of the above teachings particularly with respect to the various methods which can be utilized with respect to the mixing of the solid powders or the squeeze casting with the liquid metal as long as they are taught to one skilled in the art by the above disclosure and the following claims. It is therefore to be understood that within the scope of the appended claims, the invention may be practiced otherwise than as specifically described herein.

What is claimed as new and desired to be secured by Letters Patent of the United States is:

1. A process for producing a superconductor material from high temperature oxide-metal superconductive composites with high mechanical properties, comprising the steps of;
   mixing together the appropriate portions of a superconductive powder, a metal and a compound selected from the group consisting of an oxygen donor, a fluorine donor and mixtures thereof; and
   sintering under pressure said mixed together portion to thereby form said superconductive element which is macroscopically uniform and which contains from 20 to 90% by volume of said metal, 80 to 10% by volume of said superconductive powder and 1 to 20% by volume of said compound, wherein said step of sintering involves sintering at approximately 600° C. for approximately five hours under flowing oxygen.

2. A process according to claim 1 further comprising the step of grinding said mixture until a uniform color is produced and pressing said mixture into pellets under a ram pressure.

3. The process according to claim 1 wherein said oxygen donor is one of $Ag_2O$ and $CdO$.

4. The process according to claim 1 wherein said metal is one of aluminum and copper.

5. A process for producing a superconductor material from high temperature oxide-metal superconductive composites with high mechanical properties, comprising the steps of:

mixing together the appropriate portions of a superconductive powder, a metal and polytetrafluoroethylene; and sintering under pressure said mixed together portion to thereby form said superconductive element which is macroscopically uniform and which contains from 20 to 90% by volume of said metal, 80 to 10% by volume of said superconductive powder and 1 to 20% by volume of said polytetrafluoroethylene.

* * * * *